(12) United States Patent
Ho et al.

(10) Patent No.: US 7,399,695 B2
(45) Date of Patent: Jul. 15, 2008

(54) INTEGRATED DIE BUMPING PROCESS

(75) Inventors: Kai-Kuang Ho, Hsin-Chu (TW);
Kuo-Ming Chen, Hsin-Chu Hsien (TW)

(73) Assignee: United Microelectronics Corp., Hsin-Chu (TW)

( * ) Notice: Subject to any disclaimer, the term of this patent is extended or adjusted under 35 U.S.C. 154(b) by 35 days.

(21) Appl. No.: 11/535,987

(22) Filed: Sep. 28, 2006

(65) Prior Publication Data
US 2007/0054483 A1 Mar. 8, 2007

Related U.S. Application Data

(62) Division of application No. 10/905,490, filed on Jan. 6, 2005, now Pat. No. 7,241,678.

(51) Int. Cl.
*H01L 21/44* (2006.01)
(52) U.S. Cl. ............................... 438/612; 257/E21.508
(58) Field of Classification Search ................... 438/612
See application file for complete search history.

(56) References Cited

U.S. PATENT DOCUMENTS

| 6,537,831 B1 | 3/2003 | Kline | |
|---|---|---|---|
| 6,639,324 B1 * | 10/2003 | Chien | 257/778 |
| 6,864,116 B1 | 3/2005 | Kim et al. | |
| 6,869,809 B2 | 3/2005 | Yu et al. | |
| 6,919,508 B2 | 7/2005 | Forcier | |
| 6,921,716 B2 | 7/2005 | Huang et al. | |
| 7,038,287 B2 * | 5/2006 | Kim et al. | 257/433 |
| 7,061,122 B2 | 6/2006 | Kim et al. | |
| 7,061,123 B1 | 6/2006 | Chee et al. | |
| 7,081,404 B2 | 7/2006 | Jan et al. | |
| 2002/0190369 A1 * | 12/2002 | Hikita et al. | 257/686 |
| 2003/0030137 A1 | 2/2003 | Hashimoto | |
| 2003/0057563 A1 * | 3/2003 | Nathan et al. | 257/777 |
| 2003/0203539 A1 | 10/2003 | Islam et al. | |
| 2004/0250229 A1 | 12/2004 | Tran | |
| 2005/0191836 A1 * | 9/2005 | Tzeng et al. | 438/612 |
| 2005/0269687 A1 | 12/2005 | Forcier | |
| 2005/0274003 A1 | 12/2005 | Lee | |
| 2006/0063311 A1 * | 3/2006 | Ho et al. | 438/127 |

* cited by examiner

*Primary Examiner*—Thao P. Le
(74) *Attorney, Agent, or Firm*—Winston Hsu

(57) ABSTRACT

An integrated die bumping process includes providing a load board, defining a plurality of die regions on a surface of the load board for placing dice of a plurality of die specifications, affixing a plurality of dice respectively on the die regions according to the plurality of die specifications, and performing a die bumping process.

10 Claims, 9 Drawing Sheets

INTEGRATED DIE BUMPING PROCESS

CROSS REFERENCE TO RELATED APPLICATIONS

This application is a division of U.S. application Ser. No. 10/905,490 filed Jan. 6, 2005, and incorporated herein by reference in its entirety.

BACKGROUND OF THE INVENTION

1. Field of the Invention

The invention relates to a die bumping process, and more particularly, to an integrated die bumping process which integrates dice of different die specifications on a same load board for simultaneously performing a die bumping process.

2. Description of the Prior Art

The flip-chip technology is an advanced semiconductor fabrication technology that allows the overall package size to be made very compact. The flip-chip package configuration differs from conventional ones particularly in that the semiconductor chip is mounted in an upside-down manner on a substrate and electrically coupled to the same by means of solder bumps provided on the active surface of the semiconductor chip. Since no bonding wires are required, the overall size of the flip-chip package can be made very compact as compared to conventional types of package configurations. Therefore, it is a trend recently to manufacture semiconductor chips with wafer bumping processes.

During the early development stage before semiconductor chips mass production, different semiconductor chips to be manufactured utilize a silicon shuttle service provided by United Microelectronics Corp. (UMC). Silicon shuttle service is capable of manufacturing dice of different uses and specifications on a same wafer simultaneously to reduce production costs and shorten the cycle time. However, semiconductor chips that require die bumping processes of the flip-chip package configuration are not well suited for being manufactured by the silicon shuttle service since the respective mask expenses of wafer bumping processes need to be considered. If these semiconductor chips further perform wafer bumping processes or single die bumping separately after completing silicon shuttle service and dicing, higher costs, more complicated processes and longer cycle times will be needed, and the bump size will be restricted.

SUMMARY OF THE INVENTION

It is therefore a primary objective of the present invention to provide an integrated die bumping process to solve the above-mentioned problems.

According to the objective of the present invention, an integrated die bumping process of the present invention includes providing a load board, defining a plurality of die regions on a surface of the load board for placing dice of a plurality of die specifications and each die region therein used to place a plurality of dice of a same die specification, affixing a plurality of dice respectively on the die regions according to the plurality of die specifications, and performing a die bumping process. The integrated die bumping process further includes a leveling step when the dice on each die region have different thickness to make the bump pads of each die affixed on each die region be located on the same level, and a step that forms a plane layer on the load board surface where the load board surface is not covered by the dice after completing the step of affixing the dice.

Since the present invention integrates dice taken from different wafers, formed by different manufacturing processes, and requiring the flip-chip package configuration on a same load board to perform a die bumping process, semiconductor chips that require wafer bumping processes of the flip-chip package configuration are suited to be manufacture by the silicon shuttle service to reduce production costs, mask expenses of wafer bumping processes and shorten the cycle time.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
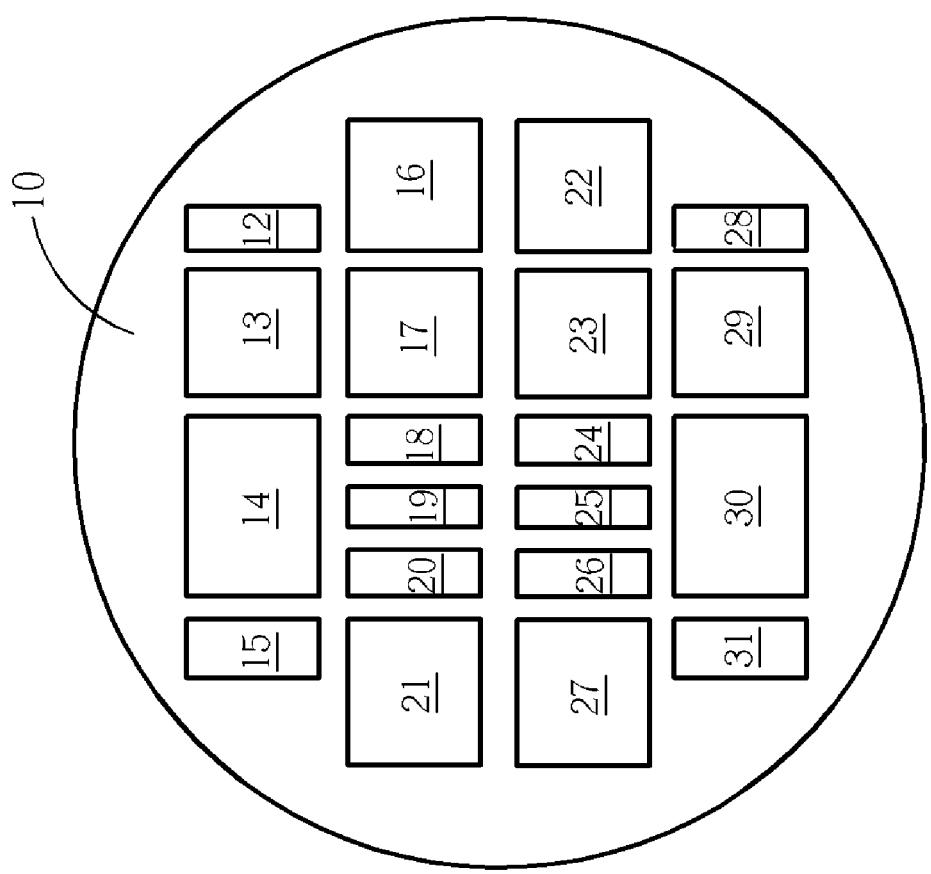
FIG. 1 is a schematic diagram of a load board surface of an integrated die bumping process according to the present invention.

Please refer to FIG. 1. FIG. 1 is a schematic diagram of a load board surface of an integrated die bumping process according to the present invention. As shown in FIG. 1, a surface of a load board 10 according to the present invention has a plurality of die regions 12-31 defined for placing dice of a plurality of die specifications. Each die region 12-31 is used to place a plurality of dice of a same die specification. The die specifications mentioned above include factors such as die thickness, die size, the quantity of the bump pads, the disposed location of the bump pads, or any combination of the above.

Figure 2:
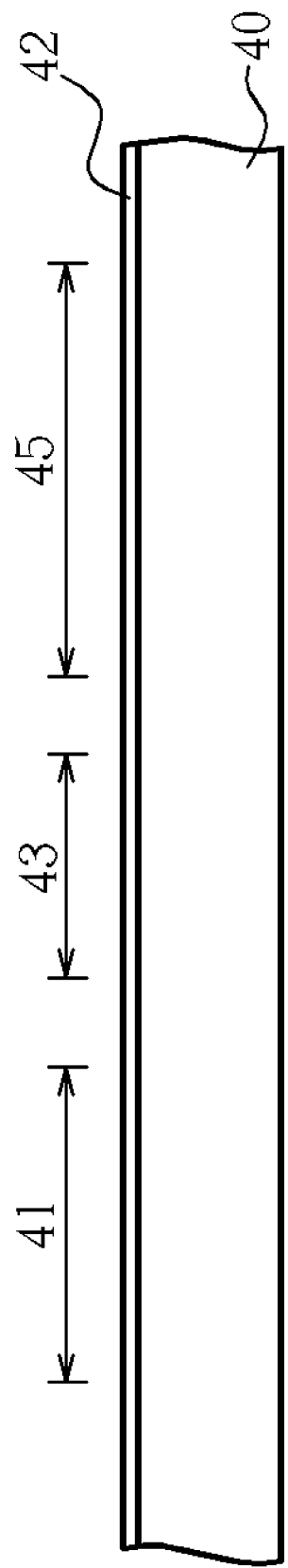
FIG. 2 to FIG. 7 are schematic diagrams for illustrating an integrated die bumping process according to a first embodiment of the present invention.

Please refer to FIG. 2 to FIG. 7. FIG. 2 to FIG. 7 are schematic diagrams for illustrating an integrated die bumping process according to a first embodiment of the present invention. As shown in FIG. 2, a load board 40 is provided. The load board 40 is a glass substrate, which offers good support and heat conducting characteristics. However, the present invention is not restricted to using glass substrates. Other load boards with the same functions may be applied in the present invention, such as a semiconductor wafer, quartz, and a metal board. A surface of the load board 40 includes a sticking layer 42 and is defined a plurality of die regions 41, 43, and 45 for placing dice of a plurality of die specifications. The sticking layer 42 is selected from the group consisting of B-stage epoxy, blue tape, twin adhesive tape, ultraviolet adhesive tape, thermal curing adhesive tape, photoresist, and wax, and utilizes spin coating, sticking, and depositing to form on the surface the load board 40.

Figure 3:
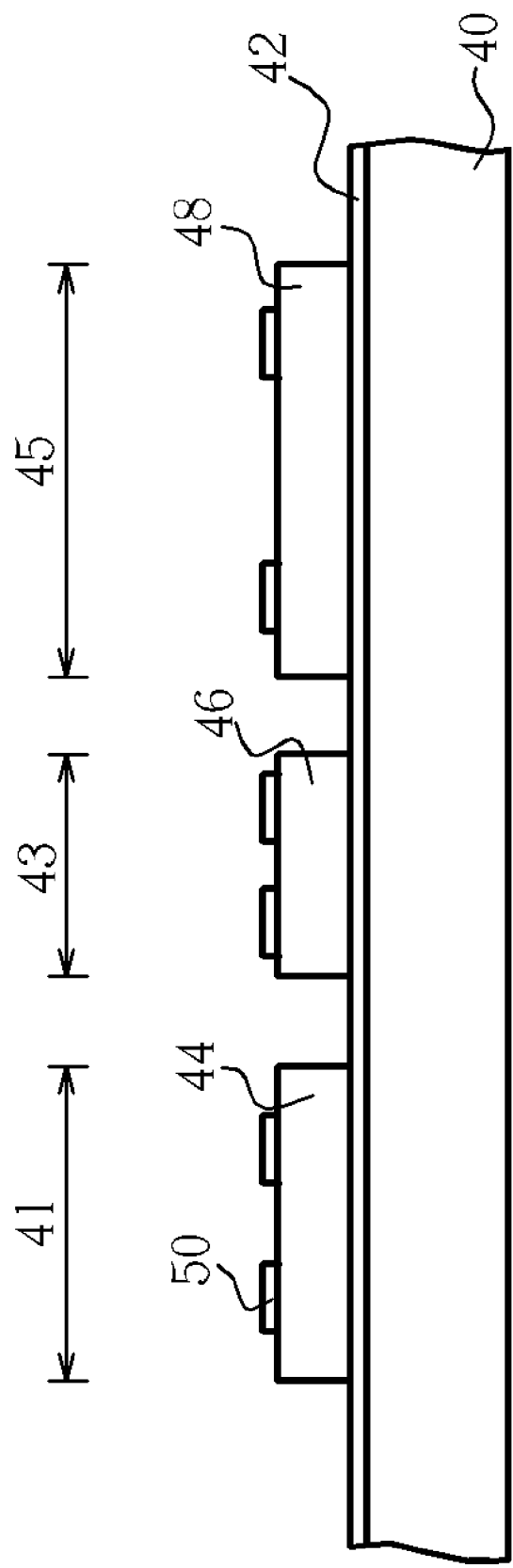

As shown in FIG. 3, a plurality of dice 44, 46, and 48, which are taken from a same wafer or different wafers, or formed by a same manufacturing process or different manufacturing processes, are placed in an array configuration and affixed respectively on the die regions 41, 43, and 45 according to the corresponding die specifications. For the sake of simplicity, figures in the following text only display a single die. Surfaces of the dice 44, 46, and 48 all include a plurality of bump pads 50, and the present invention may further perform a leveling step before affixing the dice 44, 46, and 48 respectively on the die regions 41, 43, and 45 according to the corresponding die specifications, such as grinding the lower surfaces of the dice 44, 46, and 48 to make the dice 44, 46, and 48 have a same thickness, and then to make the bump pads 50 of the dice 44, 46, and 48 affixed on the die regions 41, 43, and 45 be located on the same level. The leveling step is favorable for the following processes.

Figure 4:
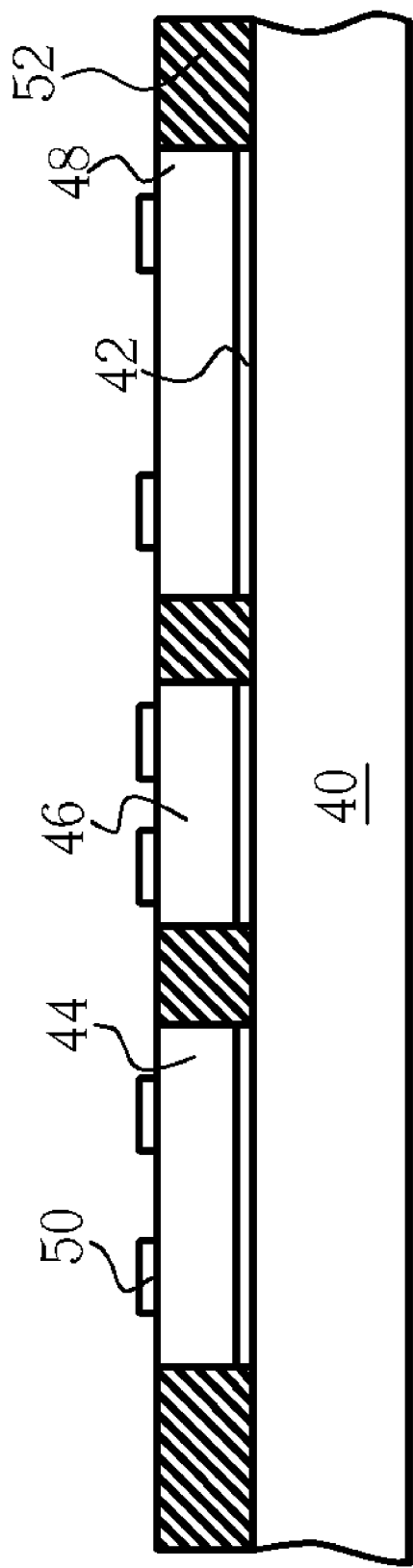

Please refer to FIG. 4. The sticking layer 42 is cured to firmly affix the dice 44, 46, and 48 on the surface of the load board 40 after the dice 44, 46, and 48 are disposed on the die regions 41, 43, and 45. Then, the portion of the load board 40 that is not covered by the dice 44, 46, and 48 has a plane layer 52 formed on it by spin coating or depositing. The plane layer 52 is made of benzocyclobutene (BCB) or polyimide (PI). Then, a cure process is performed to firmly affix the plane layer 52.

Figure 5:
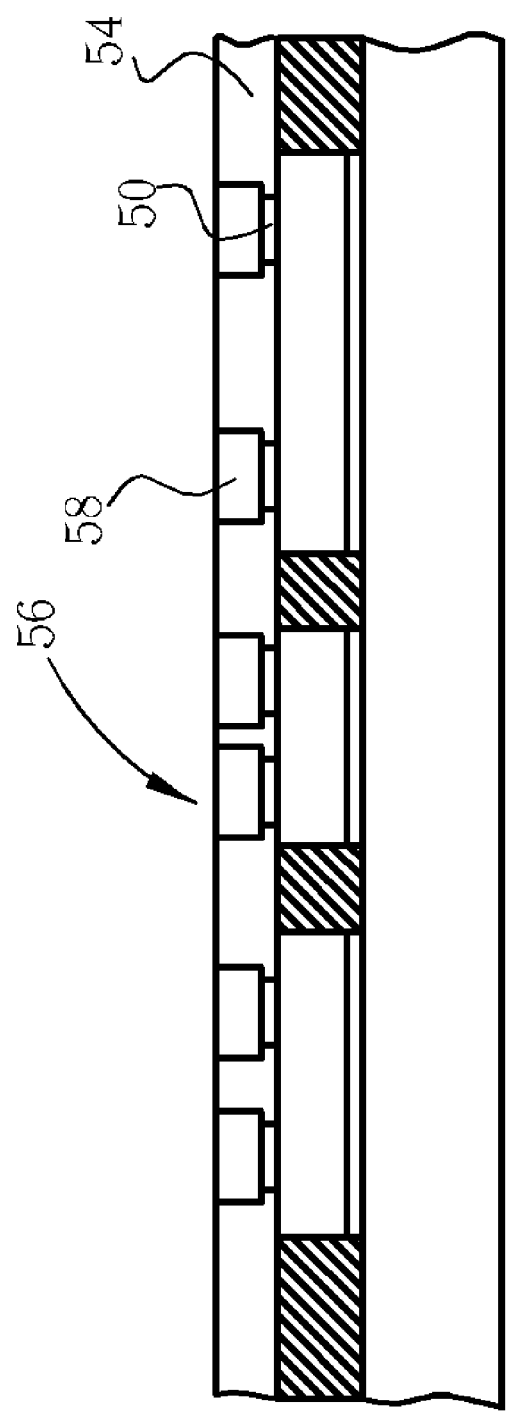

As shown in FIG. 5, a die bumping process is performed. A dielectric layer 54 is formed on the surface of the load board 40 to cover each bump pad 50. A plurality of contact holes 56 are formed by a photolithography and etching process in the dielectric layer 54 and corresponding to each bump pad 50 location to expose each bump pad 50. An under bump metallurgy (UBM) process is performed to form a metal layer 58 on the surface of each bump pad 50 in each contact hole 56.

Figure 6:
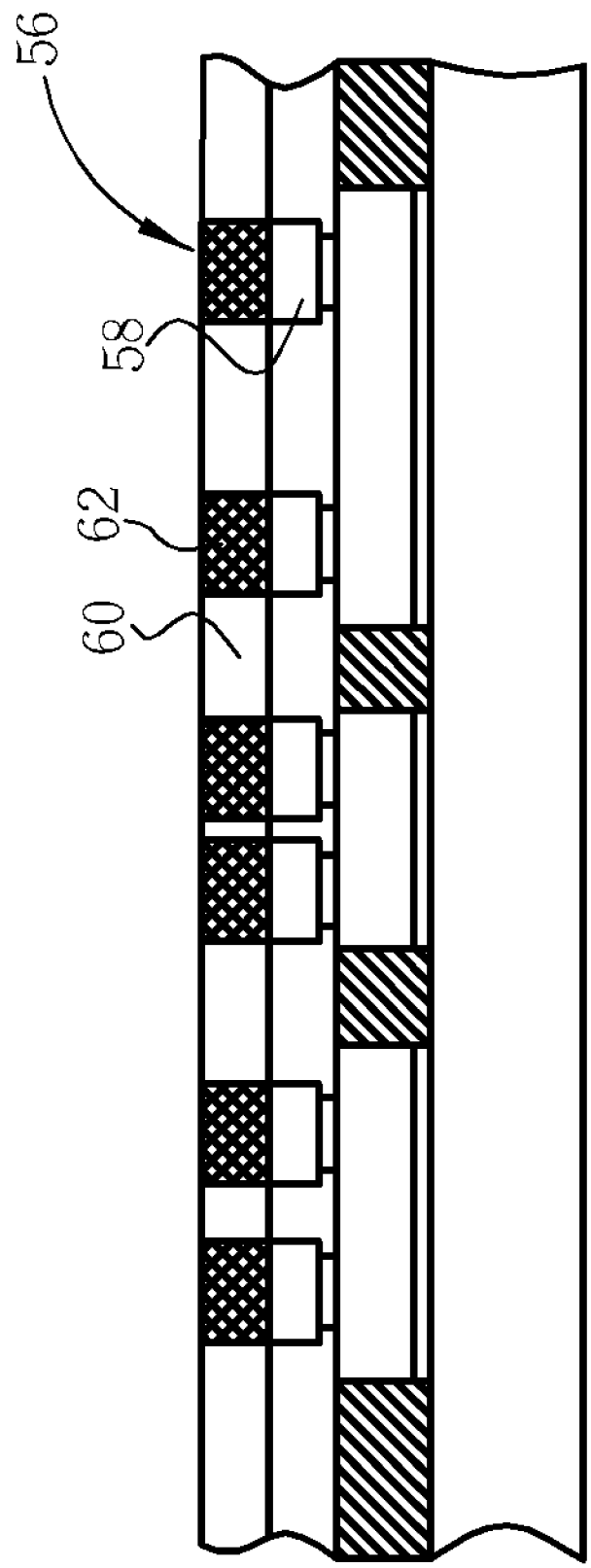

As shown in FIG. 6, a plurality of solder bumps 62 are formed on each metal layer 58 corresponding to the location of each contact hole 56 by utilizing a mask 60, which is made before the step of defining the die regions, and a solder printing process. The mask 60 is made according to the die regions on the load board planned in advance, the dice on each die region, and the bump pad location on each die. Therefore, a pattern of the mask 60 corresponds to the die regions of different die specifications.

It is to be noted that the step of manufacturing the mask 60 also could be executed after the step of affixing the dice 44, 46, and 48. For example, the mask 60 is formed after scanning the load board 40 with the dice 44, 46, and 48 affixed on it, and the pattern of the mask 60 corresponds to the dice 44, 46, and 48 on the load board 40. Moreover, the solder bumps 62 also could be formed by utilizing a mask made in advance and a thin-film, photolithography, etching process, and solder electroplating or printing. Similarly, the step of manufacturing the mask could be executed before or after the step of affixing the dice 44, 46, and 48.

Figure 7:
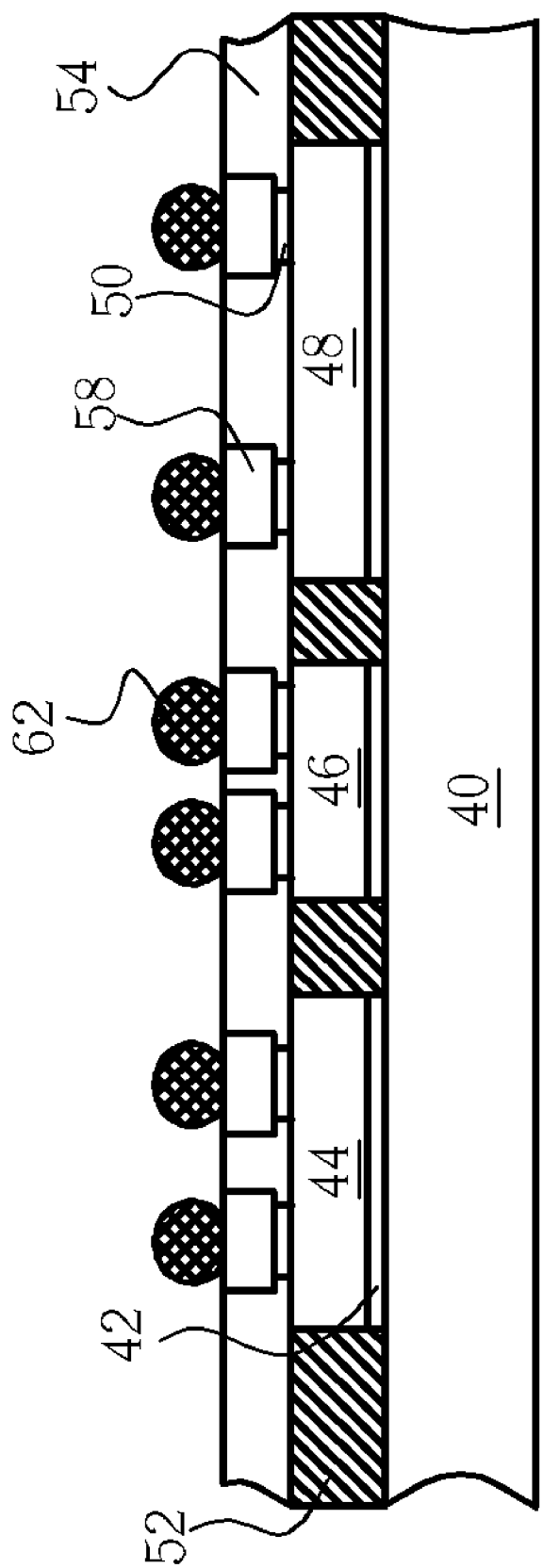

As shown in FIG. 7, the mask 60 is removed, a reflow process is executed, and then the die bumping process is finished. After finishing the die bumping process, the present invention further includes a cutting process to separate the dice 44, 46, and 48.

Figure 8:
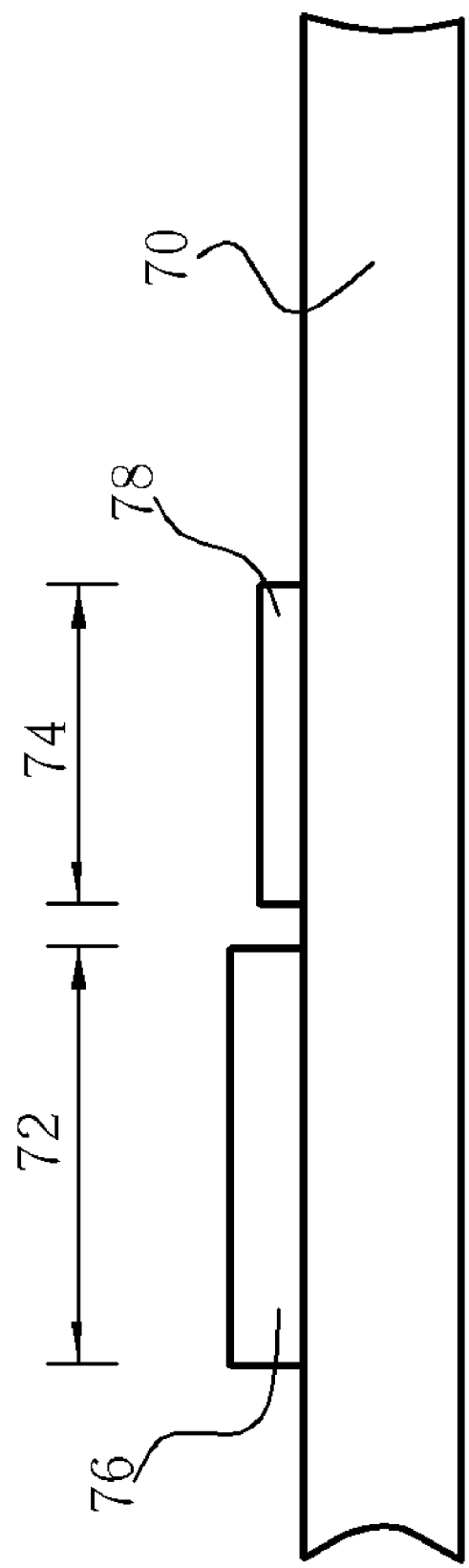
FIG. 8 and FIG. 9 are schematic diagrams for illustrating an integrated die bumping process according to a second embodiment of the present invention.
Figure 9:
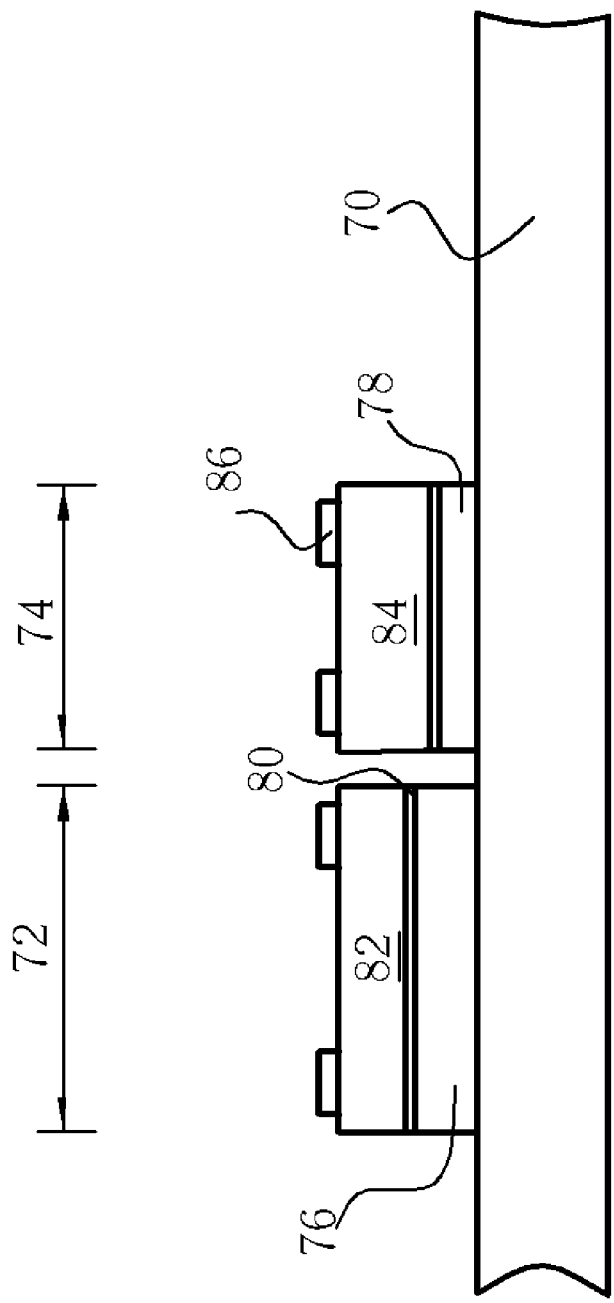

FIG. 8 and FIG. 9 are schematic diagrams for illustrating an integrated die bumping process according to a second embodiment of the present invention. The difference between the first embodiment and the second embodiment of the present invention is the leveling step. As shown in FIG. 8, according to different die thickness, a plurality of bottom layers 76 and 78 of different thickness are formed on surfaces of the die regions 72 and 74 on the load board 70.

As shown in FIG. 9, a plurality of dice 82 and 84 has different die thickness and the lower surfaces of the dice 82 and 84 have a sticking layer 80. The dice 82 and 84 are affixed on the bottom layers 76 and 78 on the surface of the die regions 72 and 74. Therefore, a plurality of bump pads 86 of the dice 82 and 84 affixed on the die regions 72 and 74 are located on the same level.

Since the present invention integrates dice taken from different wafers, formed by different manufacturing processes, and requiring the flip-chip package configuration on a same load board to perform a die bumping process, semiconductor chips that require wafer bumping processes of the flip-chip package configuration are suited to be manufactured by the silicon shuttle service for reducing production costs and mask expenses of wafer bumping processes and for shortening the cycle time.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An integrated die bumping process comprising:
providing a load board and a mask including a pattern on a surface;
utilizing the pattern of the mask to define a plurality of die regions on a surface of the load board for placing dice of a plurality of die specifications, wherein the die specification comprises die thickness, die size, the quantity of the bump pads, the disposed location of the bump pads, or any combination of the above, and a surface of each of the dice comprises a plurality of bump pads;
utilizing a sticking layer to affix a plurality of dice on each die region according to the corresponding die specification;
forming a plane layer on the load board surface where the load board surface is not covered by the dice after completing the step of affixing the dice, wherein the surface of the plane layer is even with the surface of the dice;
forming a dielectric layer on the surface of the load board and a dielectric layer covering on each bump pad;
utilizing the mask to perform a photolithography and etching process for forming at least a contact hole in the dielectric layer and exposing each bump pad;
performing an under bump metallurgy process to form a metal layer on the surface of each bump pad and in each contact hole; and
forming a solder bump on the metal layer corresponding to the contact hole location.

2. The integrated die bumping process of claim 1, wherein the load board is a glass substrate.

3. The integrated die bumping process of claim 1, wherein each die region is used to place a plurality of dice of a same die specification.

4. The integrated die bumping process of claim 1, wherein the plurality of dice affixed on each die region is placed as an array.

5. The integrated die bumping process of claim 1, wherein the sticking layer is selected from the group consisting of B-stage epoxy, blue tape, twin adhesive tape, ultraviolet adhesive tape, thermal curing adhesive tape, photoresist, and wax.

6. The integrated die bumping process of claim 1 further comprising a leveling step, when the dice on each die region have different thickness, to make the bump pads of each die affixed on each die region be located on the same level.

7. The integrated die bumping process of claim 1, wherein the dice are taken from different wafers and formed by different manufacturing processes.

8. The integrated die bumping process of claim 1, wherein the method of forming the plane layer is a spin coating process and the material of the plane layer is benzocyclobutene (BCB) or polyimide (PI).

9. The integrated die bumping process of claim 1 further comprising a cutting process for separating each die after completing the die bumping process.

10. An integrated die bumping process comprising:

providing a load board and a mask including a pattern on a surface;

utilizing the pattern of the mask to define a plurality of die regions on a surface of the load board for placing dice of a plurality of die specifications, wherein the die specification comprises die thickness, die size, the quantity of the bump pads, the disposed location of the bump pads, or any combination of the above, and a surface of each of the dice comprises a plurality of bump pads;

forming a plurality of bottom layers having different thickness on the die regions of the load board;

utilizing a sticking layer to affix a plurality of dice on each bottom layer;

forming a plane layer on the load board surface where the load board surface is not covered by the dice after completing the step of affixing the dice; and forming a dielectric layer on the surface of the load board and a dielectric layer covering on each bump pad;

utilizing the mask to perform a photolithography and etching process for forming at least a contact hole in the dielectric layer for exposing each bump pad;

performing an under bump metallurgy process to form a metal layer on the surface of each bump pad in each contact hole; and forming a solder bump on the metal layer corresponding to the contact hole location.

* * * * *